(12) United States Patent
Moriyama et al.

(10) Patent No.: US 6,614,501 B1
(45) Date of Patent: Sep. 2, 2003

(54) ELECTROCONDUCTIVE DEVICE HAVING SUPERCOOLED LIQUID CRYSTAL LAYER

(75) Inventors: Takashi Moriyama, Kawasaki (JP); Shinjiro Okada, Isehara (JP); Akira Tsuboyama, Sagamihara (JP); Takao Takiguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 142 days.

(21) Appl. No.: 09/722,650

(22) Filed: Nov. 28, 2000

(30) Foreign Application Priority Data

Nov. 29, 1999 (JP) .......................................... 11-337901

(51) Int. Cl.$^7$ .......................... C09K 19/02; C09K 19/00
(52) U.S. Cl. ...................... 349/177; 349/171; 349/172; 349/182; 349/184; 428/1.1
(58) Field of Search ................................. 349/171, 172, 349/177, 182, 184, 186; 428/1.1, 1.2; 252/299.63

(56) References Cited

U.S. PATENT DOCUMENTS

| | | | | |
|---|---|---|---|---|
| 5,114,613 A | * | 5/1992 | Yoshinaga et al. | 252/299.01 |
| 5,683,833 A | * | 11/1997 | Haussling et al. | 136/263 |
| 5,798,197 A | * | 8/1998 | Paulus et al. | 430/56 |
| 5,858,284 A | * | 1/1999 | Konuma et al. | 264/1.38 |
| 6,159,562 A | * | 12/2000 | Kanbe et al. | 428/1.1 |
| 6,255,026 B1 | * | 7/2001 | Kahn et al. | 430/19 |

OTHER PUBLICATIONS

Lee et al., "Thermal Hysteresis in the Nematic Order of a PCH–3 Liquid Crystal", Sep. 1998, Journal of korean Physical Society, vol. 33, No. 6.*
C.W. Tang et al., "Organic Electroluminescent Diodes," 51(12) *Appl. Phys. Lett.* 913–915 (1987).
D. Adam et al., "Fast Photoconduction in the Highly Ordered Columnar Phase of a Discotic Liquid Crystal," 371 *Nature* 141–143 (1994).
Jürgen Simmerer et al., "Transient Photoconductivity in a Discotic Hexagonal Plastic Crystal," 8(10), *Adv. Mater.* 815–819 (1996).
Masahiro Funahashi et al., "Anomalous High Carrier Mobility in Smectic E Phase of a 2–phenylnaphthaline Derivative," 73(25) Appl. Phys. Lett. 3733–3735 (1998).

* cited by examiner

*Primary Examiner*—Tarifur R. Chowdhury
(74) *Attorney, Agent, or Firm*—Fitzpatrick, Cella, Harper & Scinto

(57) ABSTRACT

An electroconductive device functioning as, e.g., an organic EL device, is formed of a pair of oppositely disposed electrodes and organic compound layers disposed between the electrodes so as to be supplied with a voltage applied between the electrodes. The organic compound layers include at least one layer of a liquid crystalline organic compound in a supercooled liquid crystal phase As a result, the electroconductive device can exhibit an improved performance over a broad temperature range due to the presence of the organic compound layer in a liquid crystal phase.

10 Claims, 2 Drawing Sheets

ELECTROCONDUCTIVE DEVICE HAVING SUPERCOOLED LIQUID CRYSTAL LAYER

BACKGROUND OF THE INVENTION

The present invention relates to an electroconductive device for use in a flat panel display, a projection display, a printer, etc.

Hitherto, liquid crystal display devices have been most extensively used among flat panel display devices as space-economical man-machine interfaces. Particularly, a so-called active matrix (e.g., TFT)-type liquid crystal display device, wherein each pixel is equipped with an active element, such as a transistor, is predominantly being used since the price thereof is dropping because of improvements in production technology.

However, the nematic liquid crystals most extensively used have slow response times of almost several milliseconds, which is problematic in high-speed drawing, such as motion picture display. Further, since the birefringence of the liquid crystal varies depending on the viewing direction, the liquid crystal display is accompanied by the problem of large viewing angle-dependence.

In order to obviate the above-mentioned problems, self-luminescence-type devices capable of providing flat panels have been used in recent years, including plasma luminescence display devices, field emission devices and electroluminescence devices.

Electroluminescence devices (hereinafter, the term "electroluminescence" is sometimes abbreviated as "EL" according to common usage in the field) may be classified into inorganic EL devices and organic EL devices. An inorganic EL device is an AC-driven thin-film EL device using an inorganic semiconductor, such as ZnS. Such a device is excellent in gradation characteristic and luminance, but is problematic since it requires an AC drive voltage on the order of several hundred volts.

On the other hand, for an organic EL device, T. W. Tang, et al. demonstrated in 1987 that high-luminance light emission was realized at a low DC voltage by utilizing a laminated structure of thin films of a fluorescent metal chelate complex and a diamine molecule. The device was an organic EL device including a laminate of the above-mentioned very thin layers (a charge-transporting layer and a luminescence layer) respectively formed by vacuum deposition sandwiched between an anode and a cathode.

An organic EL device is a carrier injection-type self-luminescent device that utilizes the luminescence caused at the time of recombination of electrons and holes having reached a luminescence layer. An organic EL device has a laminated structure of cathode/organic compound layers/anode, and the organic compound layers generally assume a two-layer structure including a luminescence layer and a hole-transporting layer or a three-layer structure including an electron-transporting layer, a luminescence layer and a hole-transporting layer.

In the above structure, the hole-transporting layer has a function of effectively injecting holes from the anode into the luminescence layer, and the electron-transporting layer has a function of effectively injecting electrons from the cathode into the luminescence layer. Simultaneously, the hole-transporting layer and the electron-transporting layer have functions of confining electrons and holes, respectively, to the luminescence layer (i.e., carrier-blocking functions), thereby enhancing the luminescence efficiency.

As for these charge-transporting layers, the most important property is believed to be carrier mobility. An organic compound in an amorphous state generally shows a carrier mobility on the order of $10^5$ $cm^2$/Vsec, and this is not regarded as a sufficient transportation performance. It is believed that the luminescence efficiency is enhanced if the mobility of the charge-transporting layer can be increased so as to inject more carriers into the luminescence layer. Moreover, a higher mobility, if achieved, can allow an increase in thickness (generally on the order of several hundred Å) of a charge-transporting layer to a thickness on the order of several $\mu$m, so that the productivity can be increased while preventing short circuit between the electrodes or between the layers sandwiching the charge-transporting layer. For these reasons, extensive research and development work has been conducted on various compound materials which make up the charge-transporting layer in order to achieve higher efficiencies for organic EL devices.

Under the circumstances, there is a trend to impart a liquid crystal property to an organic compound which constitutes the charge-transporting layer. The organic film used in an organic EL device is generally in an amorphous state, and the molecular alignment therein lacks regularity. In contrast thereto, some liquid crystalline organic compounds having a certain order of molecular alignment were found to exhibit a high mobility and have gained interest in the field. For example, Haarer, et al., observed a high hole mobility of $10^{-1}$ $cm^2$/Vsec in the mesophase of a long-chain triphenylene compound that is a representative discotic liquid crystal. (Nature, vol. 371, p. 141 (1994)). Haarer, et al., also studied the relationship between the degree of molecular alignment order and hole mobility in the columnar phase of a series of triphenylene-based discotic liquid crystals and reported that a higher degree of order provided a higher hole mobility (Add. Mater., vol. 8, p. 815 (1996)).

Further, Hanna, et al. reported that a bar-shaped liquid crystal having a phenylnaphthalene skeleton in smectic E (SmE) phase exhibited a mobility of $10^2$ $cm^{-2}$/Vsec as a bipolar electronic conductivity for both electrons and holes (Appl. Phys. Lett., vol. 73, no. 25, p. 3733 (1998)).

Based on a self-alignment characteristic and a possibility of molecular alignment control, which is advantageous for carrier transportation of a liquid crystalline organic compound as mentioned above, it is possible to realize an excellent carrier-transporting material. Further, by enhancing the carrier-transporting performance, the applicability of the device can be extended to other electronic devices including switching devices, such as transistors.

As described above, a liquid crystalline organic compound can exhibit an excellent performance for carrier transportation and is promising for providing a charge-transporting layer of an electroconductive device.

As for actual utilization, a liquid crystalline organic compound has a mesophase (mesomorphic phase, i.e., liquid crystal phase) temperature range essentially determined by chemical structure, etc., of the compound, and all the liquid crystalline organic compounds do not show a broad mesophase temperature range. Further, there are many compounds which assume a mesophase only at high temperatures and do not show mesomorphism in a temperature range (around room temperature, e.g., 0° C.–40° C.) suitable for practical device use.

Accordingly, it is very important to provide a liquid crystalline organic compound that exhibits stable mesomorphism over a broad temperature range when laminated and disposed between electrodes as an actual form of use in an electroconductive device.

SUMMARY OF THE INVENTION

In view of the above-mentioned problems of the prior art and the above-mentioned subject, an object of the present invention is to provide an electroconductive device including a liquid crystalline organic compound layer exhibiting a stable mesomorphism as a charge-transporting layer.

Another object of the present invention is to provide an electroconductive device suitable for use in an EL device that is capable of exhibiting good luminescence characteristics.

According to the present invention, there is provided an electroconductive device comprising a pair of oppositely disposed electrodes and at least one organic compound layer disposed between the electrodes so as to be supplied with a voltage applied between the electrodes, said at least one organic compound layer including at least one layer of liquid crystalline organic compound assuming a supercooled liquid crystal phase in the state of being disposed between the electrodes.

In the electroconductive device of the present invention as described above, the mesomorphism of the liquid crystalline organic compound can be stabilized to allow the liquid crystalline organic compound layer to exhibit a better charge-transporting performance, which results in an improved luminescence performance when included in an EL device.

These and other objects, features and advantages of the present invention will become more apparent upon consideration of the following description of the preferred embodiments of the present invention taken in conjunction with the accompanying drawings.

DESCRIPTION OF THE PREFERRED EMBODIMENTS

The electroconductive device according to the present invention includes a pair of oppositely disposed electrodes and at least one organic compound layer disposed between the electrodes so as to be supplied with a voltage applied between the electrodes, characterized in that said at least one organic compound layer includes at least one layer of liquid crystalline organic compound assuming a supercooled liquid crystal phase in the state of being disposed between the electrodes.

The electroconductive device according to the present invention may be applicable to electronic devices, in general, inclusive of organic EL devices and organic TFT devices, particularly preferably to organic EL devices.

Figure 1:
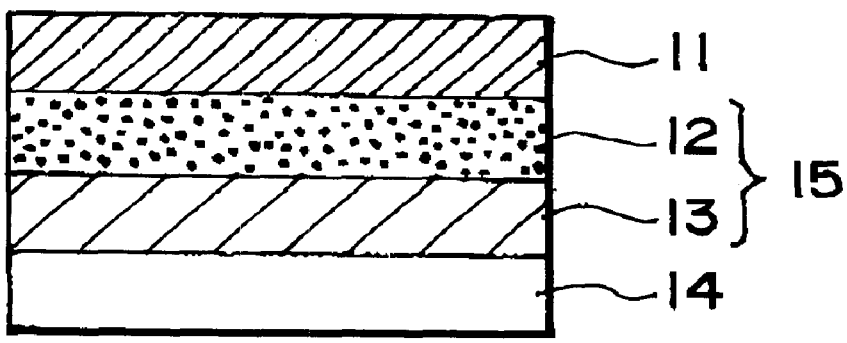
FIGS. 1 and 2 are, respectively, a sectional view illustrating an organization of an organic EL device as an embodiment of an electroconductive device according to the invention.

FIG. 1 is a sectional view which illustrates the organization of an organic EL device as an embodiment of the electroconductive device according to the present invention. Referring to FIG. 1, an organic EL device includes a cathode 11 of a metal electrode and an anode 14 of a transparent electrode for taking out luminescence therethrough. Between the electrodes 11 and 14, organic compound layers are sandwiched, each having a thickness on the order of generally about several hundred Å (angstroms). The cathode 11 may generally comprise a metal having a small work function, such as aluminum, aluminum-lithium alloy or magnesium-silver alloy. The anode 14 may generally comprise a conductor material having a large work function, such as indium tin oxide (ITO). Between the cathode 11 and the anode 14, organic compound layers 15 are disposed including a luminescence layer 12 and a hole-transporting layer 13.

Figure 2:
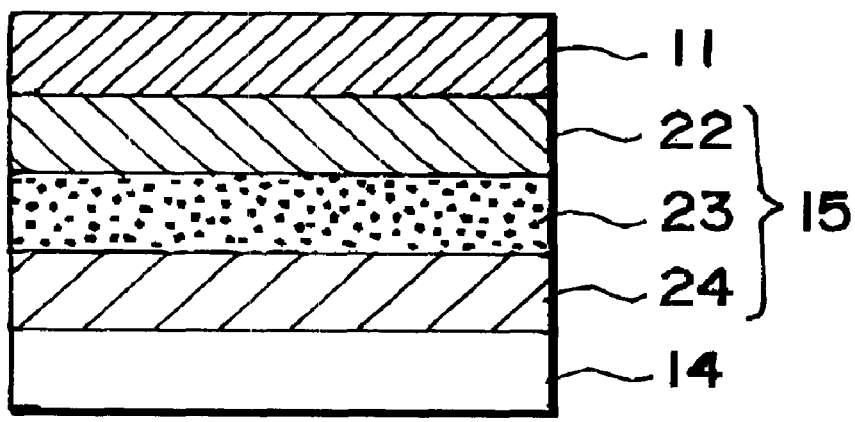

FIG. 2 is a sectional view which illustrates the organization of another organic EL device as an embodiment of the electroconductive device according to the present invention. In the organic EL device, the organic compound layers 15 have a three-layer structure including an electron-transporting layer 22, a luminescence layer 23 and a hole-transporting layer 24.

The hole-transporting layer 13 (or 24) has a function of effectively injecting holes from the anode 14 into the luminescence layer 12 (or 23), and the electron-transporting layer 22 has a function of effectively injecting electrons from the anode 11 into the luminescence layer. Simultaneously, the hole-transporting layer and electron-transporting layer have functions of confining electrons and holes, respectively, to the luminescence layer (i.e., carrier-blocking function), thereby enhancing the luminescence efficiency.

A characteristic feature in the present invention is that the organic compound layers include at least one layer of liquid crystalline organic compound assuming a supercooled liquid crystal phase in the state of being disposed between the electrodes. Herein, the "supercooled liquid crystal phase" means a liquid crystal phase appearing in the course of cooling at a temperature below the temperature at which the liquid crystalline organic compound exhibits a phase transition into a liquid crystal phase in the course of heating.

It is preferred that the liquid crystalline organic compound layer be formed at a temperature at which a liquid crystal phase can be assumed. It is also preferred that the supercooled liquid crystal phase of the liquid crystalline organic compound be formed through a re-alignment process of the organic compound layer, wherein the organic compound layer once formed at a lower temperature around room temperature is heated into an isotropic phase temperature and then gradually cooled to an operating temperature for providing the supercooled liquid crystal phase.

It has been found that such a supercooled liquid crystal phase can be better retained at a smaller thickness of the organic compound layer, while the retainability depends on a liquid crystal material used. Table 1 below shows the retainability of supercooled liquid crystal phase (S.L.C.) at room temperature for more than 100 hours at different thicknesses for several liquid crystal materials (LC1, LC2 and PN84 shown below each having a temperature for transition from crystal to a liquid crystal phase after an increase in temperature above room temperature). As shown in Table 1 below, it has been found that it is possible to retain a stable supercooled liquid crystal phase at a thickness of 20 nm or smaller.

TABLE 1

| L.C. material | Thickness | | |
|---|---|---|---|
| | 20 nm | 50 nm | 100 nm |
| LC1 | S.L.C. retained | S.L.C. retained | S.L.C. retained |
| LC2 | S.L.C. retained | Partially crystallized (70%) | Wholly crystallized (100%) |
| PN84 | S.L.C. retained | Wholly crystallized (100%) | Wholly crystallized (100%) |

S.L.C.: supercooled liquid crystal phase

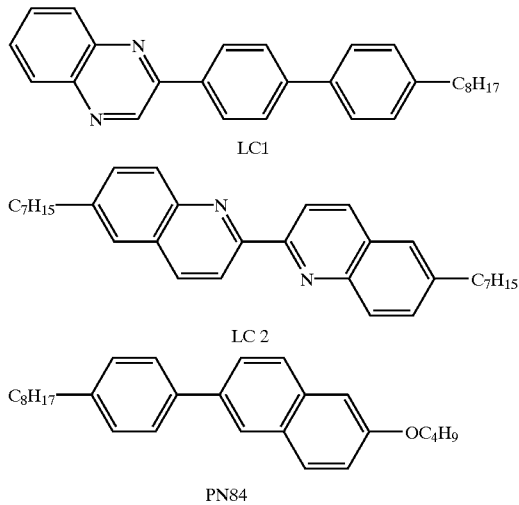

It is preferred to use a liquid crystalline organic compound (liquid crystal material) having a smectic liquid crystal phase or discotic liquid crystal phase. Specific examples thereof may include HHOT (hexakishexyloxytripheylene), HHTT (hexakis-hexylthiotriphenylene), HPOT (hexakispentyloxytri-phenylene), and PN84 (2-butoxy-6-(4-octylphenyl)-naphthalene).

The liquid crystalline organic compound layer may be incorporated as an electron-transporting layer, a hole-transporting layer or a luminescence layer in the above-mentioned EL device structure.

The liquid crystalline organic compound layer may generally be formed in a layer thickness of 0.1 nm–100 nm, but preferably 20 nm or smaller for the purpose of the present invention.

The liquid crystalline organic compound layer may be formed by vacuum deposition or spin coating.

In addition to such a liquid crystalline organic compound layer, the electroconductive device according to the present invention may include another organic compound layer which may be an electron-transporting layer, a luminescence layer or a hole-transporting layer as mentioned above used in a conventional organic EL device.

Hereinbelow, the present invention will be described more specifically based on Examples and Comparative Examples Device structures of Device Samples A–D prepared in Examples and Comparative Examples are summarized in Table 2 below.

TABLE 2

| Sample | Device Structure |
|---|---|
| A | ITO/α-NPD (50 nm)/Alq3 (50 nm)/LC1 (50 nm)/Al—Li/Al |
| B | ITO/α-NPD (50 nm)/Alq3 (50 nm)/Al—Li/Al |
| C | ITO/α-NPD (50 nm)/Alq3 (50 nm)/LC2 (15 nm)/Al—Li/Al |
| D | ITO/α-NPD (50 nm)/Alq3 (50 nm)/LC2 (50 nm)/Al—Li/Al |

Values in ( ) represent layer thicknesses of respective layers.

Example 1

Device Sample A having a laminate structure of ITO/α-NPD (50 nm)/Alq3 (50 nm)/LC1 (50 nm)/Al—Li/Al was prepared in the following manner.

A 1.1 mm-thick glass substrate was coated with an approximately 70 nm-thick ITO film as a transparent electrode (anode) by sputtering.

Then, a 50 nm-thick layer of α-NPD (available from Dojin Kagaku K. K.), represented by a structural formula shown below, was formed as a hole-transporting layer on the ITO film by vacuum deposition at a pressure of $2.66 \times 10^{-3}$ Pa ($2 \times 10^{-5}$ Torr).

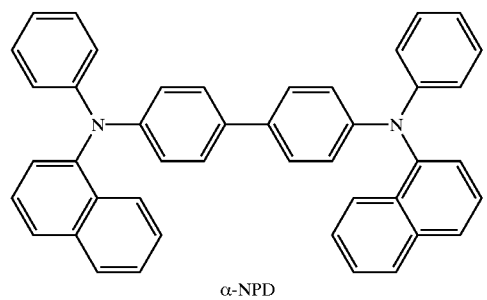

α-NPD

Then, on the hole-transporting layer, a 50 nm-thick layer of Alq3 (aluminum quinolinol complex), represented by a structural formula shown below, was formed as a luminescence layer by vacuum deposition at a pressure of $2.66 \times 10^{-3}$ Pa.

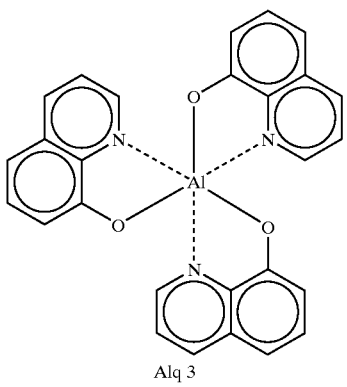

Alq 3

Then, on the luminescence layer, a 50 nm-thick layer of LC1, represented by a structural formula shown below, and showing a phase transition series of Cry. (69.0° C.) SmE (87.9° C.) SmA (173.1° C.) Iso on temperature increase was formed by vacuum deposition at a pressure of $2.66 \times 10^{-3}$ Pa ($2 \times 10^{-5}$ Torr), while the glass substrate was backed by a heater for keeping a substrate surface temperature of 80° C. so as to keep the liquid crystal phase (SmE phase) of LC1.

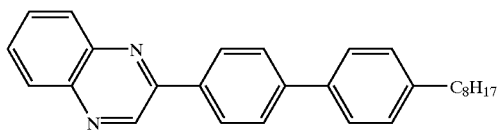

Then, on the layer of LC1, a 10 nm-thick layer of Al—Li alloy (Li: 1.8 wt. %) as a cathode metal electrode and a 150 nm-thick layer of Al as a protective electrode layer were successively formed by vacuum deposition at a pressure of 2.66×10⁻³ Pa (2×10⁻⁵ Torr), to obtain Device Sample A.

Device Sample B having a laminate structure of ITO/α-NPD (50 nm)/Alq3 (50 nm)/Al—Li/Al for comparison was prepared in the same manner as Sample A described above, except formation of the layer of LC1 was omitted.

Figure 3:
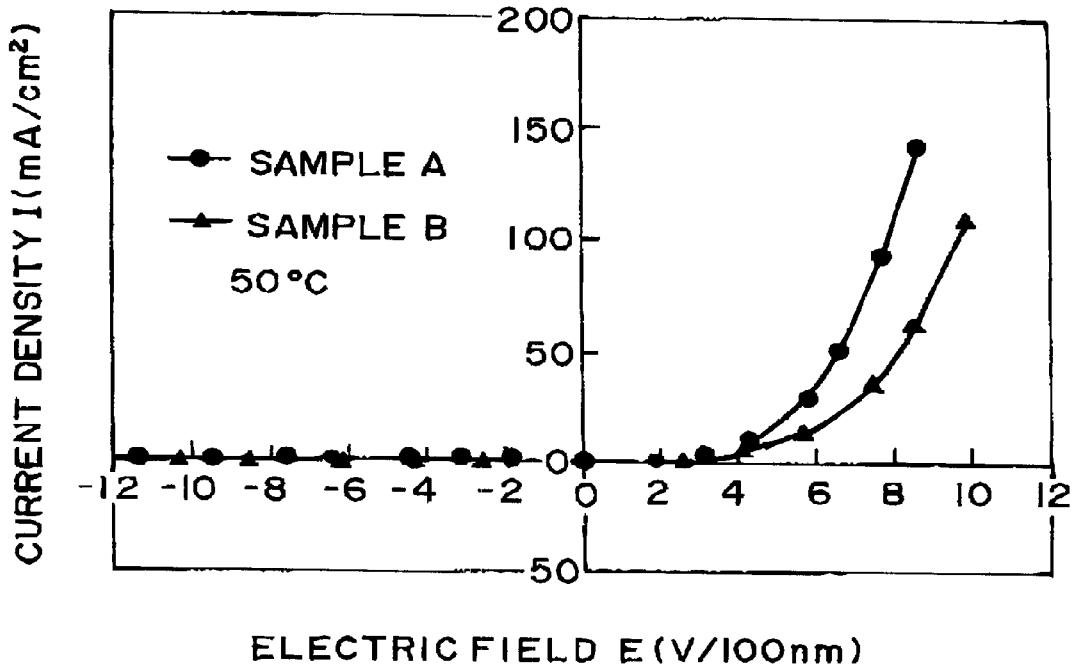
FIG. 3 is a graph showing E (electric field)-I (current) characteristics of sample organic EL devices A and B prepared in Example 1 described hereinafter.

The above-prepared organic EL devices of Samples A and B were respectively subjected to application of DC voltage between the Al—Li electrode (as the cathode) and the ITO electrode (as the anode), whereby E (electric field)-I (current) characteristics as shown in FIG. 3 were exhibited at 50° C. As shown in FIG. 3, Sample A device, obtained by inserting the layer of LC1 as an electron-transporting layer in Sample B device exhibited improved E-I characteristics and correspondingly higher luminances than Sample B device.

After observation of the luminescence state of Sample A device at room temperature through a microscope, no region of crystallization was observed, so that it was confirmed that the layer of LC1 retained a supercooled liquid crystal phase.

Example 2

Device Sample C having a laminate structure of ITO/α-NPD (50 nm)/Alq3 (50 nm)/LC2 (15 nm)/Al—Li/Al was prepared in the following manner.

Similarly as in Example 1, a glass substrate coated with an ITO electrode (anode) was further coated with a 50 nm-thick layer of α-NPD (hole-transporting layer) and a 50 nm-thick layer of Alq3 (luminescence layer).

Then, on the luminescence layer, a 15 nm-thick layer of LC2, represented by a structural formula shown below, and showing a phase transition series of Cry. (81.6° C.) SmX (unidentified smectic phase) (128.7° C.) N (131.7° C.) Iso after a temperature increase was formed by vacuum deposition at a pressure of 2.66×10⁻³ Pa (2×10⁻⁵ Torr), while the glass substrate was backed by a heater for keeping a substrate surface temperature of 90° C. so as to keep the liquid crystal phase (SmX phase) of LC2.

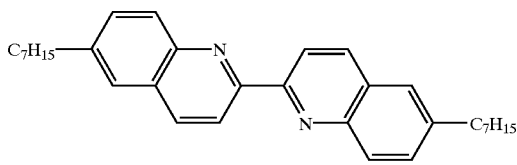

Then, on the layer of LC2, a 10 nm-thick layer of Al—Li alloy and a 150 nm-thick layer of Al were formed by vacuum deposition similarly as in Example 1 to obtain an organic EL device of Sample C.

Figure 4:
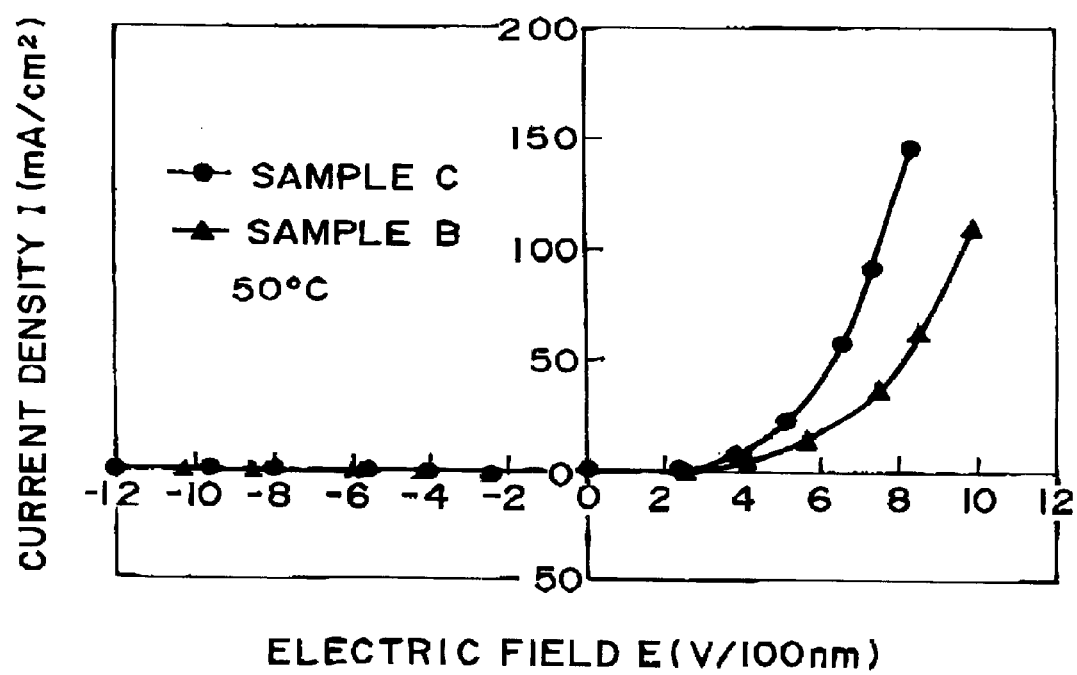
FIG. 4 is a graph showing an E (electric field)-I (current) characteristic of a sample organic EL device C prepared in Example 2 in parallel with the sample device B.

Sample C device was subjected to an application of DC voltage similar to Example 1 to show an E-I characteristic as shown in FIG. 4, wherein the E-I characteristic of Sample B device is also shown for comparison. Thus, as shown in FIG. 4, Sample C device, obtained by inserting the layer of LC2 as an electron-transporting layer in Sample B device, exhibited improved E-I characteristics and correspondingly higher luminances than Sample B device.

After observation of the luminescence state of Sample C device at room temperature through a microscope, no region of crystallization was observed, so it was confirmed that the layer LC2 retained a supercooled liquid crystal phase.

Comparative Example 1

Device Sample D having a laminate structure of ITO/α-NPD (50 nm)/Alq3 (50 nm)/LC2 (50 nm)/Al—Li/Al was prepared in the same manner as in Example 2 for the production of Device Sample C except that the layer of LC2 was formed in an increased thickness of 50 nm.

The thus-prepared Sample C device was subjected to application of DC voltage similar to Example 2, whereby the E-I characteristics were remarkably lower than those of Sample C device and comparable to those of Sample B device.

After microscopic observation of the luminescence state of Sample D device at room temperature, the device exhibited a region of non-luminescence called a "dark spot" over about 70% of the entire luminescence area due to crystallization and loss of uniformity of the layer of LC2.

What is claimed is:

1. An electroconductive device comprising:
   a pair of oppositely disposed electrodes, and
   at least one organic compound layer disposed between the electrodes so as to be supplied with a voltage applied between the electrodes,
   wherein said at least one organic compound layer includes at least one liquid crystalline organic compound layer in a supercooled liquid crystal phase, which is achieved by cooling the liquid crystalline organic compound to a temperature below a phase transition temperature at which the liquid crystalline organic compound exhibits a liquid crystal phase during a heating process.

2. The electroconductive device according to claim 1, wherein the liquid crystalline organic compound layer was initially formed at a temperature at which the liquid crystalline organic compound assumes a liquid crystal phase.

3. The electroconductive device according to claim 1, wherein the supercooled liquid crystal phase of the liquid crystalline organic compound layer was formed through re-alignment of the liquid crystalline organic compound layer.

4. The electroconductive device according to claim 1, wherein said liquid crystalline organic compound has a smectic liquid crystal phase.

5. The electroconductive device according to claim 1, wherein said liquid crystalline organic compound has a discotic liquid crystal phase.

6. The electroconductive device according to claim 1, wherein said liquid crystalline organic compound layer has a thickness of at most 20 nm.

7. The electroconductive device according to claim 1 operating as an electroluminescence device.

8. The electroconductive device according to claim 7, wherein said liquid crystalline organic compound layer is an electron-transporting layer.

9. The electroconductive device according to claim 7, wherein said liquid crystalline organic compound layer is a hole-transporting layer.

10. The electroconductive device according to claim 7, wherein said liquid crystalline organic compound layer is a luminescence layer.

* * * * *